United States Patent [19]

Halberstein

[11] Patent Number: 4,754,158

[45] Date of Patent: Jun. 28, 1988

[54] DUAL THRESHOLD SENSITIVE TRANSISTOR TURN-OFF CIRCUIT

[75] Inventor: Mark J. Halberstein, Richardson, Tex.

[73] Assignee: Texas Instruments Incorporated, Dallas, Tex.

[21] Appl. No.: 737,841

[22] Filed: May 28, 1985

[51] Int. Cl.[4] .................. H03K 3/01; H03K 17/56; H03K 3/33

[52] U.S. Cl. .................. 307/254; 307/315; 307/317 A; 307/296 R

[58] Field of Search .................. 307/254, 315, 317 A, 307/300, 296 R, 270; 323/289

[56] References Cited

U.S. PATENT DOCUMENTS

| | | | |
|---|---|---|---|
| 3,831,102 | 8/1974 | Medal | 307/300 |
| 3,959,665 | 5/1976 | Gilbreath et al. | 307/270 |
| 4,132,906 | 1/1979 | Allen | 307/300 |
| 4,318,011 | 3/1982 | Zeis | 307/300 |
| 4,491,744 | 1/1985 | Corey | 307/300 |

Primary Examiner—Stanley D. Miller
Assistant Examiner—B. P. Davis
Attorney, Agent, or Firm—James T. Comfort; Leo N. Heiting; Melvin Sharp

[57] ABSTRACT

A DC coupled transistor turn-off circuit (12) responsive to a first DC voltage level for reverse driving the base of an output transistor (Q4), and responsive to a second DC voltage level for removing the reverse base drive. A turn-off transistor (Q5) is connected to the base (22) of the output transistor (Q4) for reverse driving it, and another transistor (Q6) is connected to the turn-off transistor (Q5) for turning it off. A pair of diodes (32, 34), each with different forward voltage drops, are connected between the respective bases of the turn-off circuit transistors (Q5, Q6) and a circuit input node (16). When the rising edge of the input voltage at such node reaches the first DC level, the first diode (32) conducts and activates the turn-off transistor (Q5) which reverse drives the base of the output transistor (Q4). On reaching a second higher DC voltage on the rising circuit node voltage, the second diode (34) conducts and turns off the turn-off transistor (Q5), thus removing the reverse drive of the output transistor (Q4).

4 Claims, 1 Drawing Sheet

U.S. Patent   Jun. 28, 1988   4,754,158
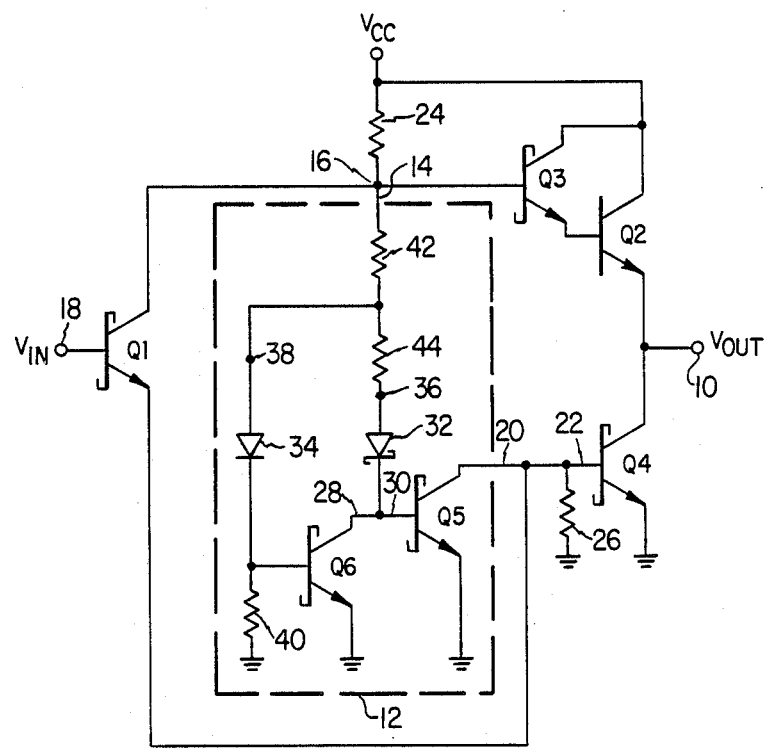

DUAL THRESHOLD SENSITIVE TRANSISTOR TURN-OFF CIRCUIT

TECHNICAL FIELD OF THE INVENTION

The present invention relates in general to transistor switching circuits, and more particularly relates to circuits for reducing the turn-off times of switching transistors.

BACKGROUND OF THE INVENTION

It is well recognized that the efficiency of a transistor switching circuit is related to the rise and fall times of the transitions between switching states. A fast rise and fall time reduces that period of time when the circuit is switching and the power dissipation is the greatest. Because an important commercial consideration of transistors is its maximum operating frequency, there is an ongoing effort to develop faster solid state structures and circuits.

Because the fall or turn-off time, of a bipolar transistor is in many instances longer than its rise time, special attention and emphasis has been placed on decreasing the turn-off time of transistors. Power transistors with large output geometries generally represent major power dissipation elements in circuits. This is a result of the capacitance between the base and collector junction which stores enough charge to keep the transistor conducting for a short period of time even though the base drive has been removed. In fabricating solid state structures, it is a conventional practice to diffuse a small amount of gold into the device structure to enhance the recombination of holes and electrons and thereby reduce the time in which the base charge is dissipated.

It is also well known in the art that the turn-off time of transistors can be decreased by the use of a resistor connected to the base for allowing the excess base charge to leak through the resistor to ground. While this approach decreases the turn-off time, it also lowers the input impedance of the circuit and thus requires the input circuit to supply more current.

Active circuits have been developed which further improve turn-off times by reversing the base drive current of the transistor and drawing the capacitive charge out of its base-collector junction. One conventional technique for reversing the base drive involves the connection of an auxiliary transistor to the base of the power device, and capacitively coupling the auxiliary transistor with respect to the circuit input drive. Thus, when the power device drive signal is removed, the auxiliary transistor turns on momentarily to draw the base charge out of the power device. While this type of technique requires no sustaining DC current, the capacitor component requires a large amount of substrate space. Moreover, the timing capacitor and resistor values are critical in producing a time constant which maintains the auxiliary transistor active for a predetermined period of time.

Another approach for drawing the base charge out of a power device involves the use of an auxiliary transistor also connected to the power device base to reverse the base current, but which auxiliary transistor is DC coupled with regard to the input signal and is always conductive when the power device is in its off state. While this type of circuit is effective in drawing out all the base charge, and requires little substrate space, it reduces the overall circuit response as it must be deactivated before the power device can be turned on.

It is seen, therefore, that there is a need for a circuit which further improves the turn-off time of a bipolar semiconductor device, and yet overcomes the shortcomings of the techniques heretofore employed.

There is a further need for a transistor turn-off circuit which has the advantage of an AC coupled turn-off circuit, insofar as it is active momentarily, but which is DC coupled and requires very little DC current.

There is also a concomitant need for a transistor turn-off circuit with improved efficiency when operating at high switching speeds.

SUMMARY OF THE INVENTION

In accordance with the present invention, a transistor turn-off circuit is provided which substantially eliminates or reduces the problems associated with the prior art techniques.

In accordance with a principal feature of the invention, there is provided a transistor turn-off circuit which is DC coupled with regard to the input signal, but which remains active only for a predetermined period of time.

In accordance with another feature of the invention, a transistor turn-off circuit is provided with threshold sensitive components which are responsive to a first and second DC level of an input signal transition for respectively applying a reverse base drive to the power device, and then for removing such reverse drive.

In accordance with yet another feature of the invention, there is provided a transistor turn-off circuit comprising transistor, diode and resistor components, which is easily fabricated on an integrated circuit substrate and which requires little substrate area.

In accordance with a related feature of the invention, the time in which the turn-off circuit is activated is a function of circuit resistance, whereby an increased efficiency over the known techniques can be realized at high frequencies by reducing certain resistor values.

BRIEF DESCRIPTION OF THE DRAWING

Further objects and features of the present invention will become apparent from the description of an illustrative embodiment thereof, taken in conjunction with the accompanying drawing in which there is shown an exemplary gate input transistor and an output totem pole transistor arrangement, with the transistor turn-off circuit of the present invention connected therebetween.

DETAILED DESCRIPTION OF THE INVENTION

The present invention is concerned primarily with the reduction in the turn-off time of a transistor switching device. While the invention is ideally suited for use with transistor power devices, as such devices inherently have appreciable turn-off times, the invention is not restricted to such uses. For example, the transistor turn-off circuit of the invention may be used in conjunction with high speed shift register and counter flip-flop circuits to improve the efficiency thereof. At the outset it should also be understood that while the present invention is well adapted for use with NPN type semiconductor devices, the concepts of the invention may also be applied with equal advantage to other types of semiconductor devices.

Turning now to the drawing, there is shown a conventional circuit environment in which the invention may be practiced. In particular, there is illustrated a logic inverter circuit. In the logic circuit, an input transistor Q1 is arranged as a phase splitter and is responsive to a logic low at gate input 18 for driving a Darlington connected Q2-Q3 transistor pair to produce a logic high level at the gate output 10. Correspondingly, transistor Q1 is responsive to a logic high at gate input 18 for driving output transistor Q4 to produce a logic low at the gate output 10. The output transistors Q2-Q4 form the coventional totem pole output structure for actively sourcing as well as sinking load current. Not by necessity, but rather for circuit speed considerations, transistors Q1, Q3, and Q4, and transistors Q5-Q6 to be subsequently described, are fabricated with Schottky clamped base-collector junctions.

More specifically, the logic inverter is constructed by connecting the base of input transistor Q1 to the gate input 18. The collector of input transistor Q1 is connected to a circuit node 16 and thence to the base of Darlington transistor Q3. The emitter of input transistor Q1 is connected to the base 22 of output transistor Q4. The base of Darlington transistor Q3 is connected to circuit node 16, and through an internal load resistor 24 to the positive supply voltage VCC. The collectors of Darlington transistors Q2 and Q3 are tied to the positive supply voltage VCC. The emitter of the output transistor Q4 is tied to circuit ground, and a base resistor 26 is connected from the base of output transistor Q4 to circuit ground. The totem pole structure is completed by connecting the emitter of Darlington transistor Q2 to the collector of output transistor Q4, such connection also forming the gate output 10.

The foregoing circuit provides a basic logic inverter function. In accordance with the invention, the transistor turn-off circuit 12, located within the dashed lines of the figure, is provided to improve the turn-off time of output transistor Q4. The transistor turn-off circuit 12 is constructed by connecting the base 30 of a turn-off transistor Q5 to the collector 28 of a transistor Q6. The emitters of both transistors Q5 and Q6 are grounded. The base of turn-off transistor Q5 is connected as well to the cathode of a Schottky diode 32, while the anode of such diode 32 is connected to one end of a resistor 44. The junction of the Schottky diode anode and the resistor 44 form node 36. The other end of resistor 44 is connected to one terminal of resistor 42. The base of transistor Q6 is connected to circuit ground through a resistor 40, and connected as well to the cathode of a PN junction diode 34. The anode of such diode 34 is connected to a node 38 formed by the connection of resistors 42 and 44.

The transistor turn-off circuit 12 of the invention has an input 14 comprising the other terminal of resistor 42 which is connected to circuit node 16. The transistor turn-off circuit input 14 is thus DC coupled to signals representative of the gate input 18, albeit inverted by the input transistor Q1. The collector of turn-off transistor Q5 provides an output 20 of the transistor turn-off circuit 12, which is connected to the base 22 of input transistor Q4. As noted above, output transistor Q4 is the device whose turn-off time it is desired to decrease.

A logic high level on gate input 18 causes input transistor Q1 to conduct, thereby supplying current through internal load resistor 24 to drive the base 22 of output transistor Q4, thus causing it to conduct. When conducting, output transistor Q4 draws collector current from the gate external load (not shown) through the gate output 10. Because it is desired to drive the output transistor Q4 sufficiently to assure a low collector to emitter voltage, the excess base drive does not result in increased Q4 collector current, but rather results in an excess base charge developed across the collector-base junction, as noted above.

A logic low on the gate input 18 will remove the drive to base 22 of output transistor Q4, whereby supply current will flow through internal load resistor 24 and turn on the Darlington connected Q2-Q3 transistor pair. When transistor Q2 conducts, Q2 collector current flows through the gate output 10 and a logic high level is developed across the gate external load.

During output transistor Q4 turn-off, the excess charge in the base-collector junction thereof will sustain conduction for a short period of time, even though its drive current from input transistor Q1 has been removed. If the conduction of output transistor Q4 lasts sufficiently long after its drive has been removed, its conduction may overlap with the conduction of Darlington transistor Q2. In this event, output transistors Q2 and Q4 may be conducting simultaneously, thereby generating a short duration current spike from the supply VCC to ground. While this current spike is of such a short duration that it is not damaging to the circuit, it represents a power loss which becomes appreciable at high switching frequencies.

Base resistor 26, connected between the base 22 of output transistor Q4 and circuit ground, facilitates the removal of some of the base charge in output transistor Q4. A compromise in the resistance value of the base resistor 26 must be made, as the smaller it is, the more effective it becomes in removing base charge. However, the resistance value then also presents a larger loading factor on input transistor Q1.

With the foregoing in mind, the transistor turn-off circuit 12 of the invention may be added to the exemplary gate to reduce the turn-off time of output transistor Q4. With regard to the operation of the transistor turn-off circuit 12, a turn-off transistor Q5 is provided such that when it is conducting, it is operative to reverse the base drive of output transistor Q4, remove the base charge thereof and quickly force such transistor into its non-conductive state. The collector 28 of a transistor Q6 is connected to the base 30 of turn-off transistor Q5, and thus when transistor Q6 is conducting, it is operative to force turn-off transistor Q5 into its non-conductive state to thereby remove the reverse base drive to output transistor Q4.

Therefore, it should be appreciated that when input transistor Q1 conducts, it drives current into the base of output transistor Q4, and when turn-off transistor Q5 conducts, it draws current out of output transistor Q4, thereby "reverse" driving the base of output transistor Q4.

According to an important feature of the invention, the transistor turn-off circuit 12 is arranged so that during a logic high to low transition on gate input 18, turn-off transistor Q5 will conduct and reverse drive the base 22 of output transistor Q4. Subsequently, transistor Q6 will conduct and turn-off transistor Q5, whereby the reverse base drive of output transistor Q4 will be removed. The overall effect of the transistors Q5 and Q6 is thus to apply a momentary reverse base drive to output transistor such that it is ready to be subsequently forward driven by input transistor Q1.

The timed relationship in which transistors Q5 and Q6 conduct is determined by the voltage at circuit node 16 as it passes through two DC levels on its rising transition, it being understood that a falling transition at gate input 18 produces a rising transition at circuit node 16. To that end, a dual threshold circuit is provided comprising diodes 32 and 34. These diodes 32 and 34 have different forward bias voltage levels, and are connected to respective bases of turn-off circuit transistors Q5 and Q6. Particularly, diode 32 is a Schottky-type diode with a forward bias voltage of about 0.6 volt, while diode 32 is a conventional PN-type junction diode with a forward bias voltage of about 0.8 volt.

With this arrangement, turn-off transistor Q5 will become conductive when the voltage at node 36 is equal to the forward bias voltage of diode 32 plus the base-emitter junction voltage of transistor Q5, i.e., 0.6 V+0.8 V=1.4 V. On the other hand, transistor Q6 will become conductive when the voltage at node 38 is equal to the forward bias voltage of diode 34 plus the base-emitter junction voltage of transistor Q6, i.e., 0.8 V+0.8 V=1.6 V. Therefore, during output transistor Q4 turn-off, as the voltage at circuit node 16 increases from a low voltage level to a high voltage level, it will first pass through a level in which node 36 is 1.4 volts, whereby turn-off transistor Q5 will conduct and provide reverse base drive to output transistor Q4. The voltage at circuit node 16 will next pass through a level in which node 38 is 1.6 volts, whereby transistor Q6 will conduct, force turn-off transistor Q5 into a non-conducting state and effectively remove the reverse base drive to output transistor Q4.

It is seen then that the transistor turn-off circuit 12, although DC connected to the other basic circuit elements, provides a momentary reverse base drive to output transistor Q4. Because the typical transition fall time of input transistor Q1, and thus circuit node 16, is extremely short, the reverse order of conductions of transistors Q5 and Q6 does not occur during such falling transition. In other words, when the logic level on gate input 18 experiences a transition from a logic low to a logic high, the resulting high-low transition at circuit node 16 will not enable transistor Q5 to be conductive at all, provided that resistor 40 is of sufficient resistance. For the same reason that the output transistor Q4 acquires a base charge, the transistor Q6 also has a base charge when turned on. Resistor 40 is thus made large enough such that the base charge of transistor Q6 does not find a low resistance path to ground, but rather sustains conduction of transition Q6 during the short duration fall time of the voltage transition at circuit node 16.

As with any active turn-off circuit, the auxiliary transistor, such as turn-off transistor Q5, must be maintained in a non-conductive state when transistor Q1 is conducting. Otherwise, turn-off transistor Q5 would conduct input transistor Q1 emitter current and thereby deprive the output transistor Q4 of base current. As noted, on the falling transition of the voltage at circuit node 16, turn-off transistor Q5 does not become momentarily conductive as the fall time of the voltage at circuit node 16 is generally an order of magnitude smaller than the rise time. Resistor 40 is thus selected with a resistance value large enough such that the base charge of transistor Q6 is not quickly dissipated.

In practice, it has been found that with typical integrated supply voltages, a resistor 40 value of about 25 kilohm is sufficient to maintain turn-off transistor Q5 non-conductive during the logic high level to low level transition at circuit node 16. In addition, with resistor 40 of this value, the DC current drain on the circuit is minimized. Resistor 42 is selected with a resistance sufficient such that the current supplied to the transistor turn-off circuit 12 is small, but yet allows sufficient current to initially split between diodes 32 and 34 so that a portion thereof is capable of turning transistor Q6 on. Resistors 42 and 44 of selected values corresponding respectively to 10 kilohm and 1 kilohm permit the transistor turn-off circuit 12 to operate very effectively and efficiently.

While the threshold determining elements, diodes 32 and 34, are disclosed as being respectively Schottky and PN junction diodes, other threshold sensitive devices can be used with equal effectiveness. For example, a special device with a breakdown voltage of about 0.8 volt or greater could be used in place of diode 34. Moreover, be selecting diodes with thresholds different than discussed above, the time in which turn-off transistor Q5 is maintained in its conduction state can be changed. This versatility is especially advantageous as the manufacturing steps of circuits employing the invention can be changed so that the time in which reverse base drive is applied is a function of the general speed of the overall electronic circuit.

Analysis of the above-referenced circuit shows that with the internal load resistor 24 at a value of 3.4 kilohm, the performance of the circuit above 10 megahertz is far more efficient than active turn-off circuits heretofore known. In addition, the high frequency performance can be even substantially more improved by reducing the value of resistor 24, albeit at the expense of increasing DC current of the circuit.

In summary, there has been provided a transistor turn-off circuit which is DC coupled with respect to the input circuit, but yet which is effective to provide momentary reverse base drive to draw the base charge out of the output transistor. In addition, the transistor turn-off circuit is responsive to two different circuit voltage levels. On the occurrence of the first voltage level of the rising voltage, a reverse base drive is applied to the output transistor. As the rising voltage passes through second voltage level the reverse base drive to the output transistor is removed. Moreover, the transistor turn-off circuit has very low DC sustaining current and thereby does not have an appreciable affect on the total circuit power consumption.

Although the invention has been described above with a certain degree of particularity with respect to the components and arrangement thereof, it should be understood that this disclosure has been made only by way of example. Consequently, changes in the details of construction and in the arrangement of the elements, as well as possible modes of utilization, such as with PNP semiconductors, will be apparent to those familiar with the art, and may be resorted to without departing from the scope of the invention as claim below.

What is claimed is:

1. A DC voltage level sensitive momentary turn-off circuit for use with an output transistor having at least a base, collector and emitter comprising:
   a first transistor having at least a base, collector and emitter with the collector connected to the base of the output transistor;
   a second transistor having at least a base, collector and emitter with the collector connected to the base of said first transistor and the emitter connected with the emitter of said first transistor;

a first threshold means connected to the base of said first transistor and responsive to a first DC voltage level for activating said first transistor for applying reverse drive to the base of said output transistor; and a second threshold means connected to the base of said second transistor and responsive to a second DC voltage level different from said first DC level for subsequently activating said second transistor to thereby remove said reverse drive to said base of said output transistor.

2. The turn-off circuit of claim 1 wherein said first threshold means comprises a first diode with a selected voltage thereacross when conductive, and said second threshold means comprises a second diode with a voltage thereacross when conductive, the selected voltage of said second diode being higher than said selected voltage of said first diode.

3. The turn-off circuit of claim 2 wherein said first diode is a Schottky-type diode with its cathode connected to the base of said first transistor, and said second diode is a PN junction-type diode with its cathode connected to the base of said second transistor.

4. The turn-off circuit of claim 3 and further including a resistor connected between the base and the emitter of said second transistor.

* * * * *